United States Patent [19]

Bowen et al.

[11] Patent Number: 5,319,606
[45] Date of Patent: Jun. 7, 1994

[54] BLOCKED FLASH WRITE IN DYNAMIC RAM DEVICES

[75] Inventors: Andrew D. Bowen, Saugerties, N.Y.; Robert Tamlyn, Jericho, Vt.

[73] Assignee: International Business Machines Corporation, Armonk, N.Y.

[21] Appl. No.: 989,688

[22] Filed: Dec. 14, 1992

[51] Int. Cl.⁵ ............................................. G11C 8/00
[52] U.S. Cl. .......................... 365/230.06; 365/230.03; 365/900
[58] Field of Search ...................... 365/230.06, 230.03, 365/189.01, 900, 238.5, 218

[56] References Cited

U.S. PATENT DOCUMENTS

| | | | |
|---|---|---|---|
| 5,003,10 | 3/1991 | Kamisaki | 365/189.01 |
| 3,898,632 | 8/1975 | Spencer, Jr. | 340/173 R |
| 4,727,363 | 2/1988 | Ishii | 340/724 |
| 4,807,189 | 2/1989 | Pinkham et al. | 365/189 |
| 4,823,302 | 4/1989 | Christopher | 364/900 |
| 4,945,495 | 7/1990 | Ueda | 364/518 |
| 4,958,326 | 9/1990 | Sakurai | 365/230.03 |
| 4,961,171 | 10/1990 | Pinkham et al. | 365/230.05 |
| 5,029,141 | 7/1991 | Yoshimoto et al. | 365/230.03 |
| 5,046,049 | 9/1991 | Choi et al. | 365/201 |
| 5,065,364 | 11/1991 | Atwood et al. | 365/185 |
| 5,134,589 | 7/1992 | Hamano | 365/218 |

FOREIGN PATENT DOCUMENTS

0360526 3/1990 European Pat. Off.

Primary Examiner—Eugene R. LaRoche
Assistant Examiner—A. Zarahian
Attorney, Agent, or Firm—Mark S. Walker; William A. Kinnaman, Jr.

[57] ABSTRACT

A dynamic random access memory (DRAM) device that is selectively operable in a normal write mode, in a block write mode, or in a blocked flash write mode in accordance with a mode select signal. In the preferred embodiment, each column of a 512×512 DRAM is divided into eight superblocks of 64 columns, each superblock being in turn divided into eight blocks of 8 columns each. An address decoder decodes the most significant column address bits A8-A6 to provide a group select signal specifying a 64-bit superblock, the next most significant column address bits A5-A3 to provide a block select signal specifying a 8-bit block, and the least significant column address bits A2-A0 to provide a cell select signal specifying a particular column. In the normal write mode, data is written to the specified column in the specified block in the specified superblock. In the block write mode, the same data is simultaneously written to selected columns in the specified block in the specified superblock. In the blocked flash write mode, the same data is simultaneously written to selected blocks in the specified superblock. An 8-bit data input line (D7-D0) is used to provide bits that select columns in the block write mode or blocks in the blocked flash write mode.

8 Claims, 6 Drawing Sheets

BLOCKED FLASH WRITE IN DYNAMIC RAM DEVICES

BACKGROUND OF THE INVENTION

1. Field of the Invention

The present invention relates to semiconductor memories, and more particularly to the writing of a constant value to a plurality of addresses simultaneously. Still more particularly, the present invention relates to the fast writing of a constant value to a plurality of column-wise contiguous cells of the memory.

2. Background and Related Art

Computer graphics display systems, e.g., scientific workstations, are widely used to generate two-dimensional (2D) representations of three-dimensional (3D) data for scientific, engineering, manufacturing, and other applications. The image displayed on the screen is stored in a memory called the frame buffer. The frame buffer is usually comprised of both Dynamic Random Access Memory (DRAM) and Video Random Access Memory (VRAM), as is known to those skilled in the art. The rate at which new data may be written to the frame buffer determines the system's performance.

However, the performance perceived by the user is based on other factors in addition to the rate at which new image data is written to the frame buffer. For example, the amount of time spent refreshing the dynamic memory devices and scanning the image to the screen adds to the perceived amount of time required to render new data. Additionally, prior to drawing a new frame, the data in the frame buffer must be erased to provide a "clean" drawing area. The amount of time required to clear the portion of the frame buffer associated with the current application's window also adds to the total perceived time for rendering an image.

Many graphics adapters are "single buffered," meaning that there is only one bank of VRAM associated with the image on the screen. As a result, the user often sees the old image being cleared and the new image being generated because the buffer being altered and the buffer being scanned to the monitor are the same entity. Consequently, in a single-buffered system, time spent clearing the buffer greatly detracts from the front-of-screen image quality. The image quality is generally resolved by double-buffering the frame buffer; where one buffer (the update buffer) is used to generate the next image, while a second buffer (the display buffer) is displayed. Once rendering to the update buffer is complete, the buffers are swapped (usually during the monitor's vertical retrace period—the time spent waiting for the electron beam to be repositioned to the top of the screen for the next refresh). The data in the new update buffer is then erased, and the next image is rendered. In the case of a double-buffered system, the time required to clear the old image simply adds to the overall perceived rendering time.

Clearing operations are not only used to initialize the frame buffer prior to generating the screen (i.e., once per frame). Some graphics primitives require multiple passes through the hardware and the use of auxiliary bit planes in the frame buffer to tag certain pixels. Either before or after such a primitive is rendered, the auxiliary planes must be initialized. The time spent initializing the auxiliary planes also adds to the perceived rendering time of an image.

In U.S. Pat. No. 4,961,171 Pinkham and Balistreri describe a memory in which there exists an on-chip data register that may be used during ensuing write operations. On standard VRAM devices, this register is commonly known as the "color register." The use of this register is further described by Pinkham and Balistreri in U.S. Pat. No. 4,807,189, wherein they describe a means of writing the data in the color register to multiple adjacent cells. This function has been adopted in the VRAM industry as "block write." Yet another function using the color register is defined by Kamisaki in U.S. Pat. No. 5,003,510 wherein he discloses writing the value in the color register to all cells in a given memory row. This function is known to those skilled in the art as "flash write." U.S. Pat. Nos. 4,961,171; 4,807,189; and 5,003,510 are incorporated herein by reference.

In single-window (or non-windowed) systems, such as the IBM 5086 Model 2, flash write is particularly valuable in that it allows the screen to be cleared rapidly. Assuming that all 512 rows of the VRAM are cleared and that each flash write consumes 160 nanoseconds (ns), it requires only 82 microseconds (μs) to clear the entire frame buffer (window). The advent of windowed environments, such as those supported on the IBM RISC System/6000 ® (RISC System/6000 is a registered trademark of IBM Corporation), has reduced the utility of flash write because windows may occupy any sub-region of the screen, and do not map to a whole number of rows in memory. In the most time-consuming case, pixel locations within a window must be cleared (set to a constant) one at a time. Relative to flash write, this represents a 512-fold decrease in performance (there are 512 columns in a row of a standard VRAM). Block write partially addresses this issue. Block write allows a plurality of cells within a group, or "block", of cells with common most-significant bits of their address (i.e., a group of adjacent cells aligned to a given power of 2) to be written simultaneously. The most common mode of block write allows any or all of 4 contiguous column addresses to be written simultaneously as masked by 4 bits of the data bus. Some memory devices now offer 8-column block write, i.e., data may be written to any subset of the 8 columns within the selected block based on 8 bits of the data bus. Thus, there is a 128-fold (64-fold in 8-column block write parts) depreciation in the pixel-per-second clearing performance of windowed systems using block write versus flash write. As an example, it requires 648 μs to clear a 900×720 window (a common window size). This assumes 40 nanoseconds (ns) per block write cycle, 8-column block write, and a 5-way memory interleave as is common in many workstations. (Five 8-column block write VRAMs can render 40 pixels every 40 ns, or 1 pixel per nanosecond, and there are 648,000 pixels in a 900×720 window.) Further increases in bandwidth past 8-column block write is not likely because of the pins required to control the column selects would outgrow the width of the data bus.

SUMMARY OF THE INVENTION

It is therefore an object of this invention to provide a means of rendering data to a large number of column addresses simultaneously with as much granularity as possible.

It is another object of this invention to provide a new mode of writing, "blocked flash write" that allows a plurality of multi-column "blocks" to be rendered simultaneously.

In accordance with the present invention a memory device having a normal write mode, a block write mode, and a special operating mode (the "blocked flash write" mode) that allows a plurality of blocks of memory cells to be written with the same data in a single write cycle is provided. The memory device includes an array of read/write memory cells, a mode enabling means for generating a mode select signal indicating a normal write mode, a block mode or the new special write mode, an address decoder responsive to a first group of bits of a memory address to generate a first select signal specifying a group of memory cells in the array, to a second group of bits of the memory address to provide a second select signal specifying a block of memory cells in the group of memory cells, and to a third group of bits of the memory address to generate a third select signal specifying a memory cell in the block. The memory device further includes a cell selection means responsive to the first, second and third select signals and to the mode select signal, the cell selection means being responsive to a mode select signal indicating a normal write mode to select a single specified memory cell, to a block write mode select signal to select predetermined memory cells in the block specified by the first and second select signals, and to the special mode select signal for selecting predetermined blocks in the group of memory cells specified by the first select signal.

The foregoing and other objects, features and advantages of the invention will be apparent from the following more particular description of a preferred embodiment of the invention, as illustrated in the accompanying drawing wherein like reference numbers represent like parts of the invention.

BRIEF DESCRIPTION OF THE DRAWINGS

The novel aspects believed characteristic of the current invention are set forth in the appended claims. The invention itself, however, as well as the preferred embodiment therein, and further advantages thereof, is best understood when the following detailed description is read in conjunction with the accompanying drawings, wherein:

DETAILED DESCRIPTION

Figure 1:
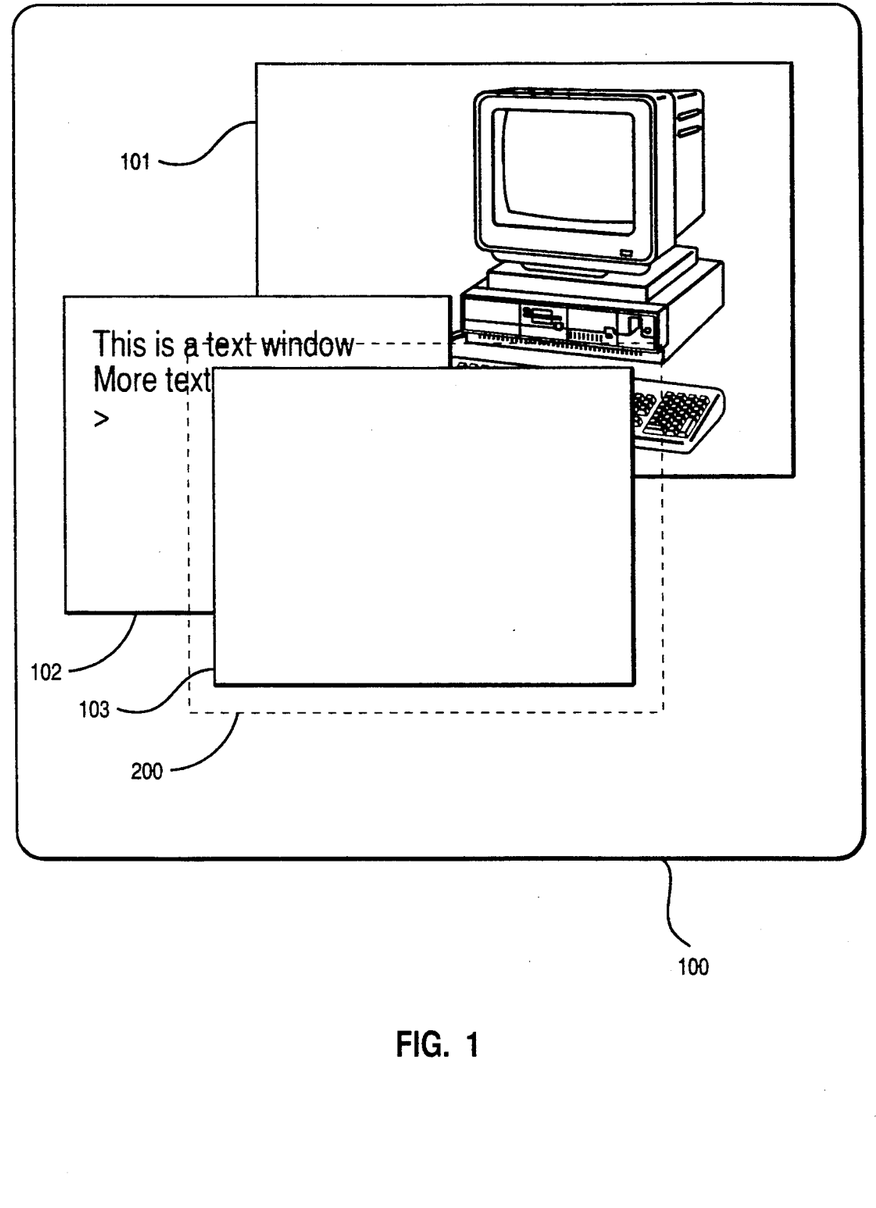
FIG. 1 is an illustration of a multiple window system as apparent from the front-of-screen.

With reference to the figures, and in particular with reference to FIG. 1, there is depicted a multiple window system as might be seen at front-of-screen. Screen 100 contains multiple simultaneous windows 101, 102, and 103. These windows may contain a variety of data and may have different applications running. Window 101 contains a complex three dimensional application, while window 102 contains a text-processing application. Window 103 is currently blank.

The DRAMs and VRAMs used in frame buffer design are "page mode" devices. In a page mode memory, successive accesses to cells (columns) within a given row are much faster than accesses made to different rows. In current devices, the overhead for accessing a new row address can be 120 ns, while a new column address may be accessed every 40 ns. In order to increase the amount of time spent in page mode, high-performance graphics adapters often take advantage of graphics' locality of reference. This means that if a pixel is rendered at a given coordinate (X,Y) that the next pixel is usually rendered nearby, usually one or both axis are updated by $\pm 1$. Consequently, mapping a row of memory to a single horizontal row of the screen means that any change in the Y coordinate of the pixel results in a new row address. Therefore, most high-performance graphics adapters "tile" the screen. In a tiled frame buffer architecture, each row of memory corresponds to a rectangular region of the screen. For example, a common array size for VRAMs is 512 rows by 512 columns; the 512 columns of a given row may be mapped to a 32-wide by 16-high patch of the screen. If the frame buffer memory is interleaved (multiple parallel banks of memory are used), as is usually the case, the tile size is multiplied by the amount of interleave. As previously indicated, a common interleave in advanced graphics is 5. This is because standard memory devices have 512 rows and 512 columns and the standard screen size is $1280 \times 1024$. Consequently, $((1280 \times 1024) / (512 \times 512)) = 5$. Normally, the memory is interleaved horizontally, which means that every fifth pixel in a horizontal line is contained in a common memory device. For example, if the pixel at (0,0) (the upper left corner of the screen) is contained in memory device #0 at row 0, column 0; pixel (1,0) is contained in the same address of device #1. Pixel (5,0) is contained in row 0, column 1 of device #0. Therefore, if each row maps to a tile that is 32 pixels wide and 16 pixels high, the aggregate tile is 160 pixels wide and 16 pixels high.

In all subsequent discussions, the memory device is assumed to have 512 rows and 512 columns. The depth of the device, i.e., the number of bits per address is not particularly relevant to the present invention. It is assumed that at least 8 bits per address are provided to allow for 8-column block write. The preferred embodiment of the present invention is the standard $512 \times 512 \times 8$ (2 Mbit) VRAM known in the art. The present invention is also contemplated for use in the $512 \times 512 \times 16$ 4 Mbit device, as well as any other memory configuration. The 16-bit data bus provided on the 4 Mbit bus is generally used to separately control the block write function to the high byte and low byte of the data. For example, data bus bits D7-D0 are used to mask the block write to the low byte of 8 column addresses. Similarly, data bus bits D15-D8 are used to mask the block write to upper byte of the same 8 column addresses. Blocked flash write can also be used in such a design.

Figure 2:
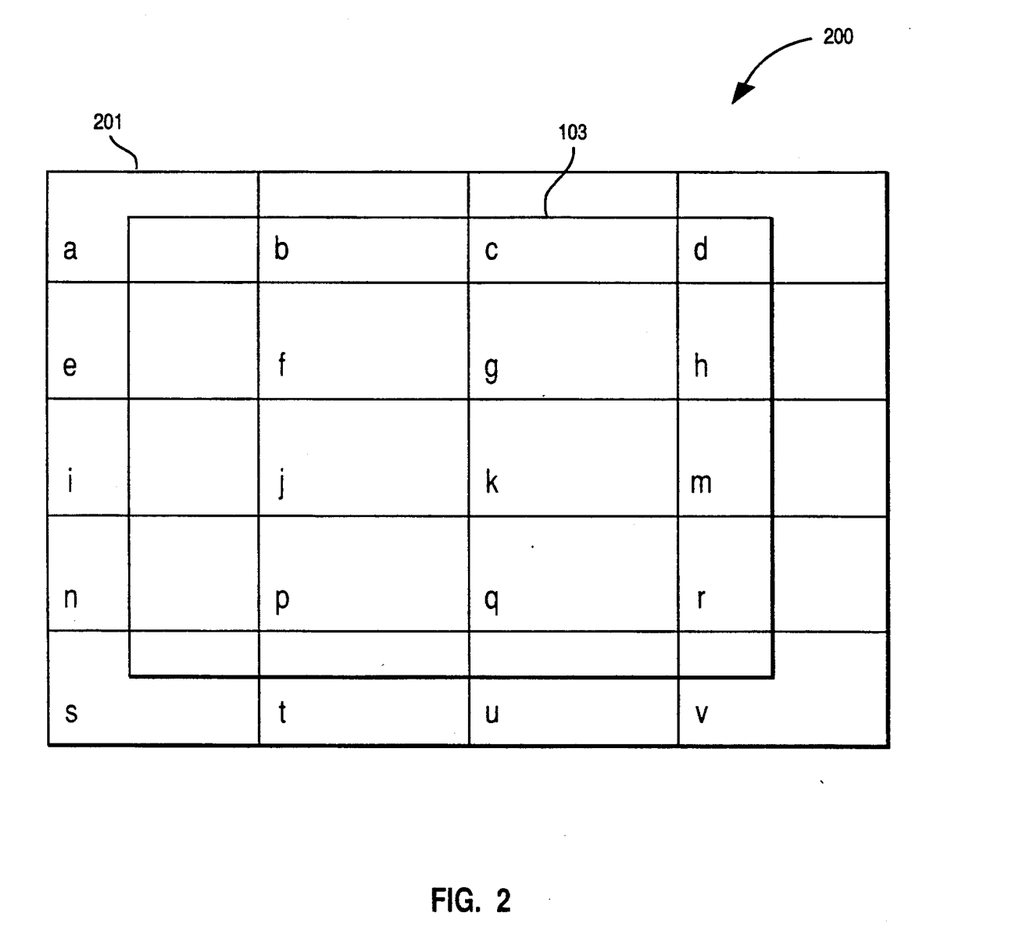
FIG. 2 illustrates the mapping of row addresses to the screen of FIG. 1.

FIG. 2 is an expanded view of region 200 in FIG. 1. Window 103 is marked in FIG. 2, and the tiles 201 are marked as 201a-201v. FIG. 2 may be interpreted in two ways. In one interpretation, all pixels within the dotted region of screen 100 are shown and each tile 201a-201v is 160 pixels wide and 16 pixels high. A second interpretation is that FIG. 2 shows only every fifth horizontal pixel of screen 100, and each tile 201a-201v is the 32×16 region associated with one VRAM. The latter interpretation is more conducive to the explanation of the present invention. As is usually the case, window 103 does not cover all tiles completely. For example, tile 201a is only partly contained within window 103. Tile 201f, however, lies completely within window 103. Flash and block write functions are used to rapidly clear those row and column address that map to pixels lying within a window. Flash write may be used to clear those rows completely contained within a window, i.e., tiles 201f, 201g, 201j, 201k, 201p and 201q. The remaining tiles are "scrubbed" by using the block write function to access only those pixels within window 103.

Figure 3:
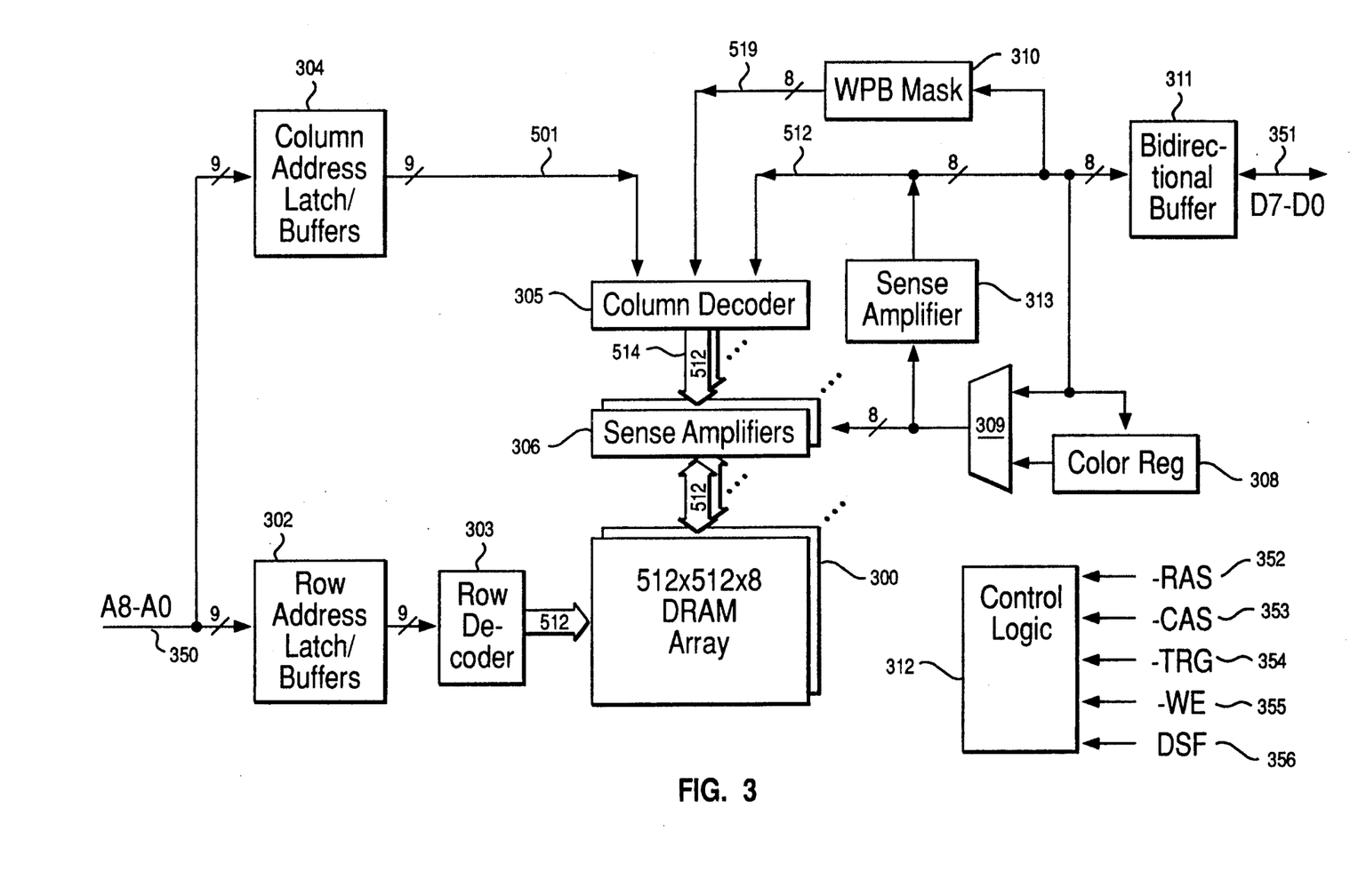
FIG. 3 illustrates a logical block diagram of the random access port of a dynamic memory device that is representative of both DRAM and VRAM memories.

FIG. 3 is a logical block diagram of the random port of a 2 Mbit dynamic memory that implements the present invention. The memory has 512 rows, 512 columns, and 8 bits per address. A VRAM, as is known to those skilled in the art, adds a second port to the depicted DRAM design. The present invention is associated solely with the random port, and as such, the depicted memory device illustrates the implementation of the present invention appropriately for both DRAM and VRAM.

In the preferred embodiment, the memory is comprised of a plurality of memory arrays 300 (one for each bit of depth associated with the memory device), each array comprised of rows and columns. When -RAS 352 (row address strobe) transitions from high to low, the address supplied on address bus 350 is latched in row address buffer 302 and subsequently decoded by row decoder 303 to enable one of the 512 rows in memory arrays 300. (The same row is selected in all 8 of arrays 300). Column decoder 305 enables one or more of the columns in the active row for accessing. In page-mode memories, the column address is latched in column latch/buffer 304 at the falling edge of -CAS 353 (column address strobe). Further explanation of the present invention assumes a standard page mode part, where the column address is latched in column latch/buffer 304 at the falling edge of -CAS 353 and decoded subsequently. One skilled in the art will readily understand changes required to implement the present invention where alternate methods of decoding the column address are used (e.g., fast page mode memory).

Column decoder 305 generates 512 column enable signals (514) for each array (bit of depth) of memory 300. Most memory devices provide a "write per bit mask" (WPBM) that allows only selected bits of the enabled columns to be written. The WPBM logic 310 generates WPB-mask 519 based on the data specified on data bus 351 at the falling edge of -RAS 352. When -WE 355 (write enable) is active (low) at the falling edge of -RAS 352, the value of the data bus is latched in WPBM logic 310 and used as WPB-mask 519 until -RAS 352 goes high (inactive). When -WE 355 is inactive (high) at the falling edge of -RAS 352, then WPBM logic 310 assumes that no mask is used, and puts a value of X'FF' on WPB-mask 519 (indicating that all bits are written). Some VRAMs now provide a "persistent write mask", where a register in WPBM logic 310 is loaded statically by a "load mask register" cycle, and enabled when a masked write is specified (-WE low at the falling edge of -RAS.) When a bit of the enabled column addresses is not written, as indicated by WPB-mask 519 having a logical B'0' in the associated bit position, all 512 column enables 514 for that bit are inactive. Although the WPBM is depicted as influencing the generation of column enables 514, other implementations of the mask function are possible within the scope of the present invention. For example, the WPBM may be used to control the data lines from multiplexor 309, and generate a "don't-write" condition for a given bit by setting both the true and compliment bit lines high (effectively refreshing the data in the selected cells, but not writing new data).

The output of column decoder 305 is coupled to memory arrays 300 by sense amplifiers 306 which amplify the output signal of the enabled cell during read operations, and pass new data to enabled cells during write operations. Data to be written may come from data bus 351 via bidirectional buffer 311. In addition, data may come from on-chip color register 308 that is loaded by a special Load Color Register memory cycle. Multiplexor 309 is used to select between the data from data bus 351 and color register 308. During read operations, sense amplifier 313 drives the read data to the data bus, otherwise sense amplifier 313 is in a high-impedance state. Multiplexor 309, as well as all of the latches are controlled based on control logic 312. Control logic 312 receives -RAS 352, -CAS 353, -TRG 354 (trigger-/output enable), -WE 355, and DSF 356 (designated for special function signal), determines the type of cycle to perform, and controls the appropriate data paths. For example, when -RAS falls, control logic 312 causes address bus 350 to be latched in row address latch 302. Similarly, when control logic 312 determines that a block write, flash write, or blocked flash write cycle is active, multiplexor 309 selects the data in color register 308, and control signals indicate to column decoder 305 that the data on data bus 351 is used to specify a portion of the column decode.

Figure 4:
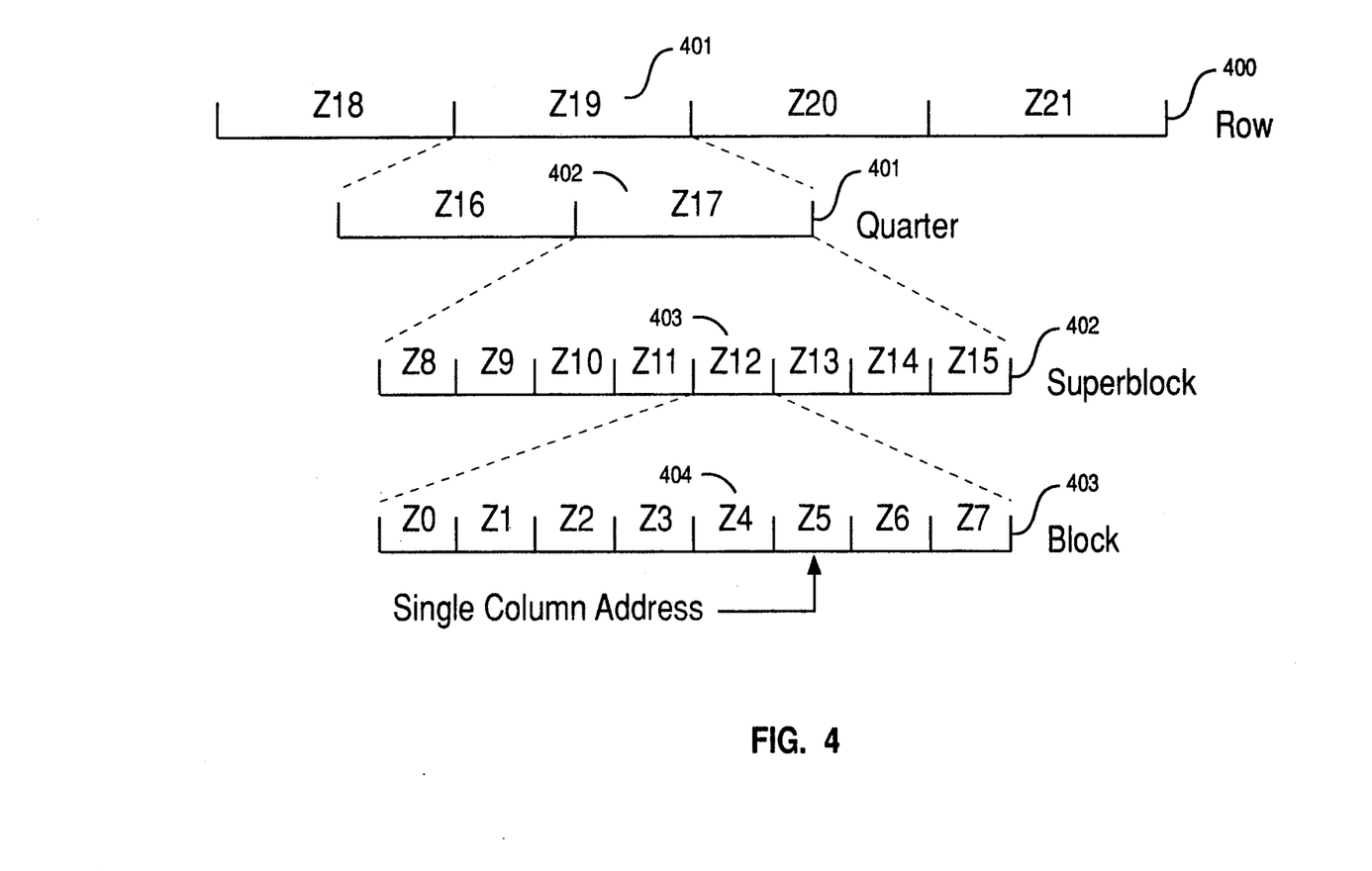
FIG. 4 illustrates the preferred embodiment of how column addresses are activated in a 512-column row of the memory device depicted in FIG. 3.

FIG. 4 depicts the preferred embodiment of how a specific column is enabled. Row 400 represents a full 512-column row of the memory array 300 (FIG. 3) in the memory device. Four column select signals (Z18-Z21) based on the most-significant two bits of the column address (A8 and A7) enable one of the four quarters 401. Once a quarter 401 is selected, column select signals Z16 and Z17 (based on column address A6) are used to activate one of the two eighths 402. In the present invention, each eighth 402 is termed a "superblock". Each superblock is 64 columns wide (512/8=64). Eight column select signals (Z8-Z15—based on the decode of column addresses A5-A3) are used to select from the eight 8-column "blocks" 403. Finally, an individual column 404 of a selected block 403 is enabled by activating its associated column select (Z0-Z7—decoded from column addresses A2-A0). For example; in FIG. 4, Z19 is selected when A8-A7 are B'01'; Z17 is activated by A6 being B'1'; Z12 is enabled by A5-A3 being B'100'; and Z0 is active when A2-0 is B'000'. Therefore, the left-most bit in the block 403 expanded in FIG. 4 is defined by address B'0 1110 0000'. Each column enable of the memory array is generated based on a 4-input AND function of the column selects (Z0-Z21). For example, column B'0 1110 0000' is enabled when Z19, Z17, Z12, and Z0 are all B'1'.

Figure 5:
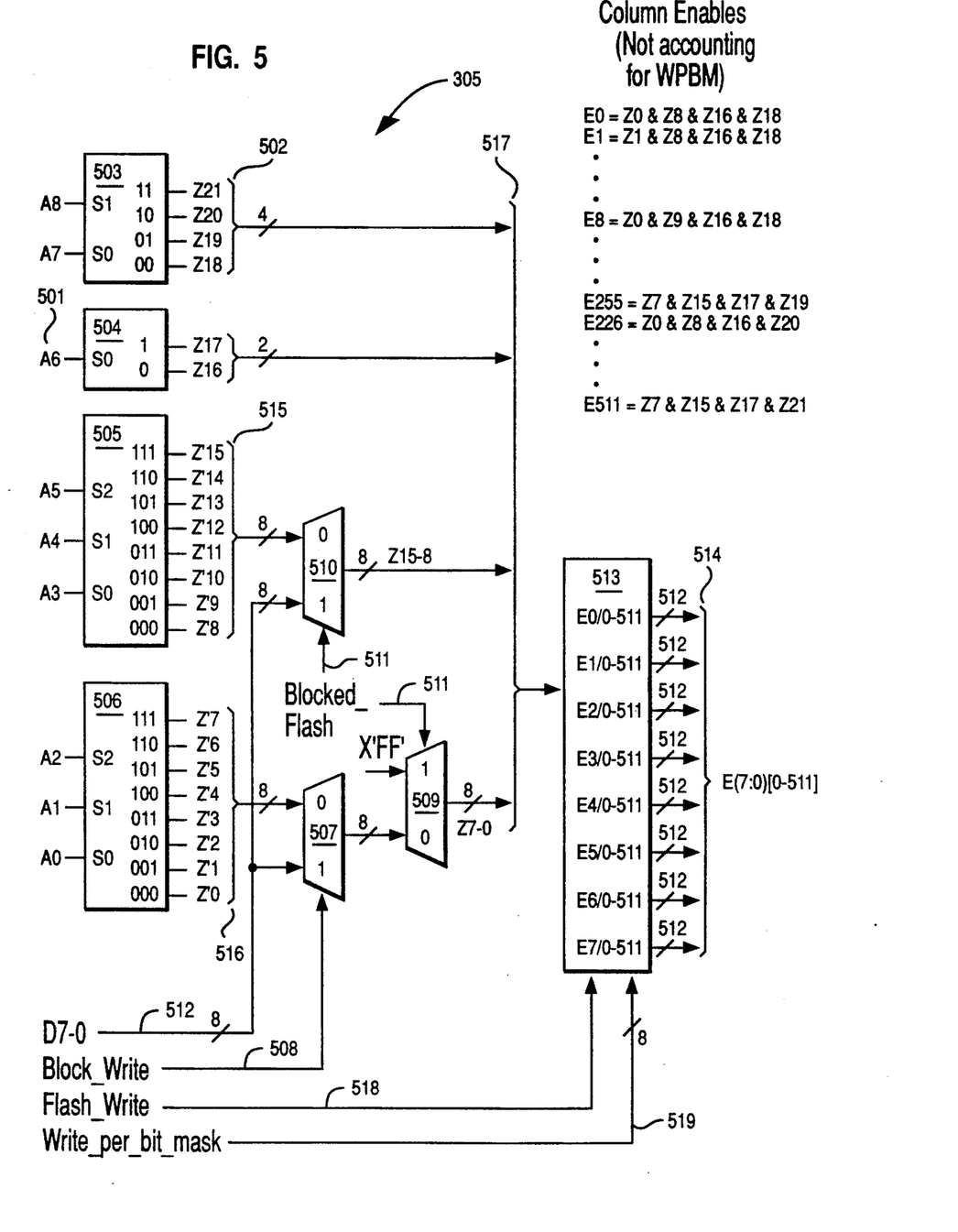
FIG. 5 illustrates a logical block diagram of the column decoder portion of the memory of FIG. 3, in which the preferred embodiment of the invention is implemented.

FIG. 5 illustrates the preferred embodiment of the present invention. FIG. 5 depicts the logic of column decoder 305 (FIG. 3) that is used to enable a plurality of the 512 columns in each row during a write operation, and a single column address during read operations. Column addresses 501 (from column address latch 304 in FIG. 3) are passed through decoders 503, 504, 505, and 506 to produce decoded address lines 502. In the preferred embodiment, the most-significant two bits of the column address 501 (A8 and A7) are passed through decoder 503 to generate bits Z18–Z21 of column select signals 517. Decoder 503 is a simple 2-to-4 decoder which asserts one of four outputs based on two input signals. For example, Z19 is asserted when A8 is B'0' and A7 is B'1'. Bit A6 of column address 501 is passed through a simple 1-to-2 decoder to generate bits Z16 and Z17 of column selects 517. As noted previously, bits Z16–Z21 of column selects 517 are used to select one 64-bit superblock 402 (FIG. 4). Bits A3–A5 are decoded by 3-to-8 decoder 505 to form partial column selects 515 (Z'8–Z'15). When the present invention is not enabled (blocked_flash signal 511 is B'0'), partial column selects 515 are used as bits Z8–Z15 of column selects 517. Lastly, bits A0–A2 of column address 501 are passed through 3-to-8 decoder 506 to form partial column select signals 516 (bits Z'0–Z'7). During normal operation, (blocked_flash 511 and block_write 508 are both B'0') partial column selects 516 are used as bits Z0–Z7 of column selects 517 into logic 513.

Logic 513 generates the 512 column enable signals 514 for each bit plane in the memory array 300 (FIG. 3). For example, E0/0-511 are the 512 column enables for bit 0 of the data. During read and normal write operations, only one column enable 514 is active (B'1') for each bit plane at a given time, enabling a single column address. When flash_write 518 is asserted, all 512 column enables 514 are set to B'1', allowing all 512 columns in the active row to be written. Additionally, the write per bit mask 519 is used to disable writing to any or all of the bit planes in the enabled columns. When a given bit in write per bit mask 519 (WPBM) is B'0', the corresponding bit plane in the enabled columns is not written. For example, a WPBM of X'F0' only enables writing to the high-order nibble of the enabled columns.

When block_write 508 signal is B'1' (indicating that a block write is being performed), partial column selects 516 are replaced by 8 bits of data bus 512 and passed to logic 513. Consequently, any combination of the 8 columns in the block 403 (FIG. 4) selected by bits Z8–Z21 of column selects 517 may be written. For example, if D7–D0 is X'03', then the first two column addresses in the active block (403 in FIG. 4) are written to.

When the present invention is active, a plurality of blocks are written to simultaneously. Bits Z0–Z7 of column selects 517 are forced to X'FF' by multiplexor 509 when blocked_flash 511 is active. This means that all 8 columns within any selected block are written in parallel. When blocked_flash signal 511 is active, multiplexor 510 selects bits of data bus 512 to replace partial column selects 515. Any or all of the 8 blocks within the superblock selected by bits Z16–Z21 of column selects 517 may be written to. For example, if data bus 512 is X'05', then columns 0–7, and columns 16–23 are written to (if the most-significant address bits are all B'0').

As is usually the case, several block write cycles are required to clear the partial tile. For example, assume tile 201b (FIG. 2) requires 10 32-pixel wide segments to be drawn. Using 8-column block write, a total of 40 cycles are required. The time required may be reduced by factor of 8 by using blocked flash write. In general, an overall performance gain of 50% (accounting of varying levels of usability, e.g., when only 7 columns are written, blocked flash write is not usable) can be realized by using blocked flash write.

Blocked flash write may be enabled in a variety of ways. In the preferred embodiment, blocked flash write is enabled based on the least-significant bit (LSB) of the column address (501 in FIG. 5) bus (A0) during a block write operation. If A0 is B'0' then a block write is performed; when A0 is B'1', a blocked flash write is performed. This method of enabling blocked flash write is preferred because it allows block writes and blocked flash writes to be performed on alternating cycles in page mode. The value of this method of enabling the present invention is better illustrated by examining the clearing of one section of window 103 as shown in FIG. 2. Assume that the region of tile 201e that lies within window 103 is 18 pixels wide and 16 pixels high. Three 8-column block write cycles are required to draw the 18 pixels in each of the 16 horizontal lines of the tile—a total of 48 cycles. The tiles depicted in FIG. 2 are 32 pixels wide, and a superblock comprises 64 cells; consequently, a superblock maps to an area 32 pixels wide and 2 pixels high in this example. The right-most 16 pixels of each horizontal line of tile 201e may be rendered using blocked flash write, requiring 8 cycles to render the 16×16 pixel region at the right-most edge of tile 201e. The remaining 2 pixels per horizontal line of tile 201e are rendered using block write, requiring 16 cycles (1 per line). When blocked flash write is used, only 24 cycles are required to clear the same region that required 48 block write cycles.

If the selection of block write versus blocked flash write is not made at the falling edge of -CAS, i.e., on a per-access basis, a full random cycle must be performed to change modes. As previously noted, a -RAS cycle requires 120 ns. If the memory controller can group all block writes and all blocked flash writes together, having to perform an extra random cycle does not severely impact the performance. However, many controllers are not designed to group the type of cycle, and would require many switches between the blocked flash write and block write modes.

Figure 6:
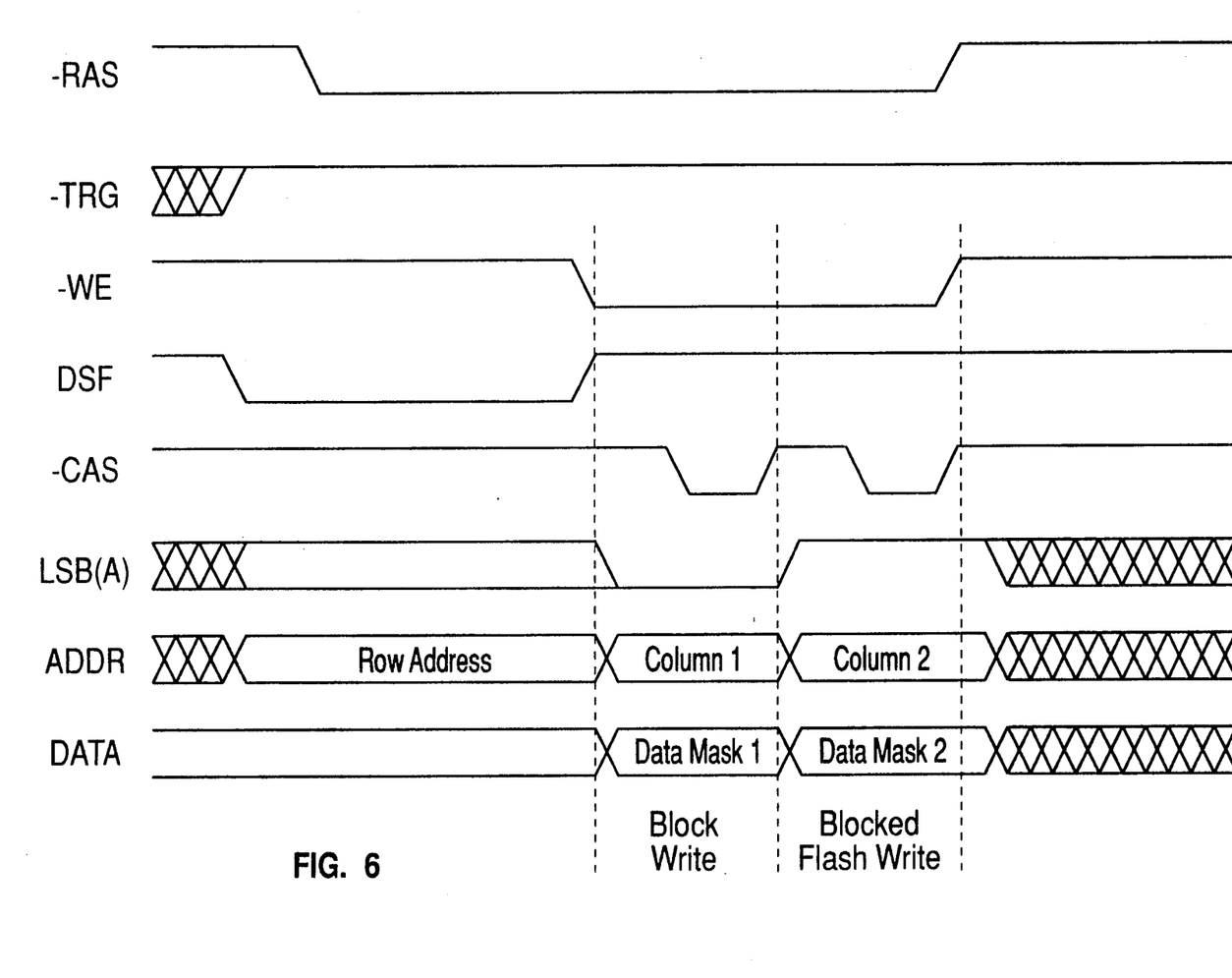
FIG. 6 illustrates the sequence of control signals necessary to activate the invention in the preferred embodiment.

FIG. 6 illustrates the generated control signals for performing a block write followed by a blocked flash write in the preferred embodiment. When -RAS falls, the -TRG and -WE signals are both high, and DSF is low. This state is consistent with the standardized method of specifying the block write cycle and is known to those skilled in the art. At the falling edge of -RAS, the row address is defined, activating a single 512-column row in the memory. The LSB of the address (indicated as LSB(A)) does not affect the selection of block write versus blocked flash write operation, and is therefore indicated as an undetermined value (high or low, but stable). At the first falling edge of -CAS, DSF is high and -WE is low, indicating that either a block write or blocked flash write cycle is being performed. In the preferred embodiment, the first -CAS cycle performs a block write because the LSB of the address is low (B'0'). The data bus is used to mask the column selects. The second -CAS cycle is a blocked flash write. This is indicated by the LSB of the address bus being high (B'1') at the falling edge of -CAS. The data bus specifies the column address mask for selecting the blocks that are written.

In order to maintain compatibility with Jedec-standard VRAM parts, the aforementioned means of enablement must be augmented. The industry standard for block write cycles specifies that the LSB of the column address is don't-care. In order to provide a device that is compliant with a memory not implementing the present invention, the present invention is enabled by a special CAS-Before-RAS Refresh with Set Register (CBRS) cycle. The CBRS cycle is generally used to set the stop register address, and may also be used to enable other special modes. The special modes are decoded from reserved values specified on the address bus of the VRAM. In the preferred embodiment, blocked flash write is enabled when, for example, a CBRS cycle is performed with an address of X'1 1000 0001'. An address of X'1 1000 0000' disables blocked flash write. (An address of X'1 1000 xxxx' is currently undefined, and reserved, in the standard truth table for VRAMs). When blocked flash write is enabled, the blocked flash write cycle is activated when the LSB of the column address is B'1' during a block write cycle. The LSB of the address is don't-care during block write cycles when blocked flash write is disabled.

Other modes of enablement are contemplated. Blocked flash write may be enabled using an external pin, or by setting the mode register available on most VRAMs. Additionally, blocked flash write may be enabled by a combination of control signals at the falling edge of -RAS (most memory cycles are defined this way). These alternate means of enabling the present invention, although more cumbersome to use, do not detract from the present invention and are considered to fall within its scope.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A system for updating a memory device having a plurality of binary storage locations, each of said binary storage locations being addressable by a row and column address and being responsive to a write enable signal, wherein said plurality of addressable columns are grouped into blocks and said blocks grouped into superblocks, the system comprising:

mode selection means for selecting between one of several modes including column update, block update, flash update and block-flash update;

means for receiving an address signal; and address translation means for translating said address signal into memory write enable signals, said address translation means being responsive to said mode selection means and said address signal such that said address signal generates a write enable signal for a single column in column update mode, said address signal generates a write enable signal for a plurality of columns in block update mode, said address signal generates a write enable for all columns in flash update mode, and said address signal generates a write enable signal for all columns in a plurality of blocks in block-flash mode.

2. The system of claim 1, further comprising means for specifying a mask having a plurality of binary digits, wherein said address translation means is responsive to said mask to specify the plurality of columns in block mode and to specify the plurality of blocks in block-flash mode.

3. The system of claim 1, wherein said address signal has a superblock address component, a block address component and a column address component, and wherein said address translation means comprises an address transformation means and a write enable generation means, and wherein said mode selection means controls said address transformation means such that said column component is transmitted to said write enable generation means only in column update mode, said block component is transmitted only in said block update mode.

4. The system of claim 2, wherein said address signal has a superblock address component, a block address component and a column address component, and wherein said address translation means comprises an address transformation means and a write enable generation means, and wherein said mode selection means controls said address transformation means such that said column component is transmitted to said write enable generation means only in column update mode, said block component is transmitted only in said block update mode.

5. The system of claim 4, wherein said mask is transmitted to said write enable means in block update mode in place of said column component, and said mask is transmitted to said write enable mans in block-flash mode in place of said block component.

6. A method for updating a plurality of memory locations in a computer memory device, said plurality of memory locations organized into addressable rows and columns, said update specifying an update mode and update address, the method comprising the steps of:

testing said update mode;

transforming said update address into a plurality of memory update enable signals based upon said update mode such that update of a single column is enabled if said update mode is normal, update of selected ones of a block of columns is enabled if said mode is block, update of all columns is enabled if said mode is flash, and update of all columns in selected ones of blocks within a set of blocks is enabled if said mode is blocked-flash.

7. The method of claim 6, wherein said transforming step comprises the steps of:

transforming said update address into a superblock address component, a block address component and a column address component;

transmitting an update enable signal for said single column identified by the combination of said superblock address component, said block address component and said column address component if in normal update mode;

transmitting update enable signals for a plurality of columns in said block identified by the combination of said superblock address component and said block address component if in block update mode; and transmitting update enable signals for all columns in a plurality of blocks in said superblock identified by said superblock address component if in blocked-flash mode.

8. The method of claim 7, wherein said plurality of columns is specified by a binary mask if in block mode, and said plurality of blocks is specified by said binary mask if in blocked-flash mode.

* * * * *